United States Patent
Tanaka et al.

(10) Patent No.: US 6,492,616 B1
(45) Date of Patent: Dec. 10, 2002

(54) PROCESSES FOR LASER BEAM MACHINING OF RESIN FILM FOR WIRING BOARDS AND MANUFACTURE OF WIRING BOARDS

(75) Inventors: Takashi Tanaka, Kisarazu (JP); Mitsuru Kohno, Kisarazu (JP); Masakazu Ii, Kisarazu (JP); Keiji Yoshizawa, Kisarazu (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/979,515

(22) PCT Filed: May 23, 2000

(86) PCT No.: PCT/JP00/03288

§ 371 (c)(1),
(2), (4) Date: Jan. 14, 2002

(87) PCT Pub. No.: WO00/72645

PCT Pub. Date: Nov. 30, 2000

(30) Foreign Application Priority Data

May 24, 1999 (JP) ............................... 11-143689
Dec. 27, 1999 (JP) ............................... 11-371292

(51) Int. Cl.[7] ................................. B23K 26/38
(52) U.S. Cl. ................................. 219/121.71
(58) Field of Search ............... 219/121.71, 121.72, 219/121.7, 121.6, 121.67; 29/833; 427/97

(56) References Cited

U.S. PATENT DOCUMENTS

| | | | |
|---|---|---|---|
| 4,027,137 A | * 5/1977 | Liedtke | 219/121.6 |
| 5,316,803 A | * 5/1994 | White et al. | 204/157.15 |
| 5,666,722 A | * 9/1997 | Tamm et al. | 29/833 |
| 6,058,132 A | * 5/2000 | Iso et al. | 219/121.6 |
| 6,211,485 B1 | * 4/2001 | Burgess | 219/121.67 |
| 6,184,490 B1 | * 2/2002 | Schweizer | 219/121.77 |

FOREIGN PATENT DOCUMENTS

| | | |
|---|---|---|
| JP | 06-200216 | 7/1994 |
| JP | 9-55563 A | 2/1997 |
| JP | 10-29079 A | 2/1998 |
| JP | 10-235481 | 9/1998 |
| JP | 10-242617 A | 9/1998 |
| JP | 11-121902 A | 4/1999 |

OTHER PUBLICATIONS

P. E. Dyer et al., J. Phys. D: Appl. Phys. 30 (1997) L19–L21.

* cited by examiner

*Primary Examiner*—Tom Dunn
*Assistant Examiner*—Jonathan Johnson
(74) *Attorney, Agent, or Firm*—Birch, Stewart, Kolasch & Birch, LLP

(57) ABSTRACT

This invention relates to a process for machining resin film for a wiring board or double-sided carrier tape which comprises forming openings in the resin film by applying a continuous-wave carbon dioxide gas laser beam which is scanned in one or two ways to the resin film or a laminate containing a layer of the resin film placed on a worktable (5) moving in the direction nearly at a right angle to the scanning direction of the laser beam (7). As a continuous-wave carbon dioxide gas laser beam is used for drilling holes, the operation is highly efficient and accurate and gives rigid-flex wiring boards or double-sided carrier tapes of good quality in high yield.

8 Claims, 4 Drawing Sheets

F I G. 1
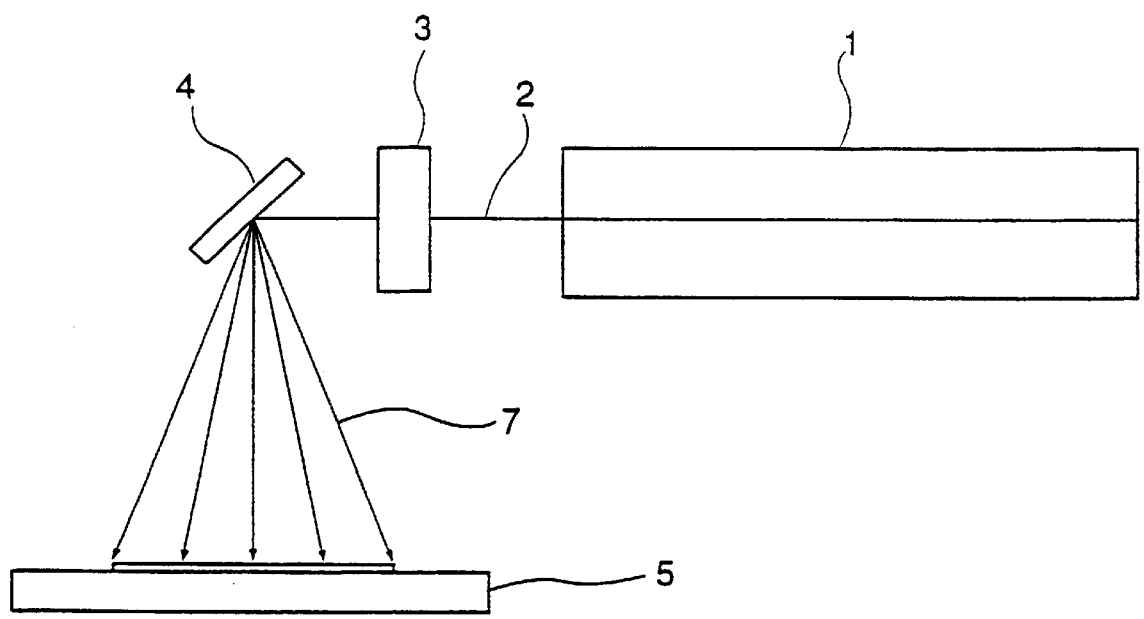

PROCESSES FOR LASER BEAM MACHINING OF RESIN FILM FOR WIRING BOARDS AND MANUFACTURE OF WIRING BOARDS

This application is the national phase under 35 U.S.C. §371 of PCT International Application No. PCT/JP00/03288 which has an International filing date of May 23, 2000, which designated the United States of America.

FIELD OF TECHNOLOGY

This invention relates to a laminate comprising at least one layer of resin film and at least two layers of patterned conductors. Furthermore, this invention relates to a process for laser beam machining of resin film for a wiring board and to a process for manufacturing a wiring board, particularly a rigid-flexible printed wiring board (often abbreviated to a rigid-flex wiring board) and a double-sided carrier tape from a laminate containing the laser beam-machined resin film as an insulating layer.

TECHNICAL BACKGROUND

Rigid-flex wiring boards and double-sided carrier tapes are laminates comprising at least one layer of resin film and at least two layers of patterned conductors and at least one of the layers of resin film has a specified plural number of openings.

A rigid-flex wiring board consists of a rigid part and a flex part and both ends of the flex part are integrated with the rigid part and electrically connected. In the preparation of such a wiring board, a method most often used first makes a rigid wiring board of a layered structure resembling an integration of both ends of the flex part and the rigid part and thereafter removes the part of the rigid layer which corresponds to the flex part.

The layered structure of the integrated rigid and flex parts contains at least one layer of flexible wiring board, at least one layer of rigid wiring board and at least one layer of resin film, the last one being placed between the layers of rigid and flexible wiring boards and acting as an adhesive layer. The layer of wiring board contains at least one layer of patterned conductor, that is, a circuit layer and a resin layer.

The aforementioned method is explained as an example. The flexible wiring board after formation of the circuit and coating with the coverlay is laminated to an insulating layer which has an opening in the cable portion to the rigid part or the portion corresponding to the flex part; on this insulating layer is placed the rigid wiring board which has a layer of conductor with a circuit formed thereon and has an opening or an area marked by a cut-off line for later removal in the portion corresponding to the aforementioned flex part, readily removable resin or a parting spacer is inserted in the aforementioned opening in the rigid wiring board if necessary, and the assembly is integrated by lamination under heat and pressure and then subjected to drilling of holes, plating with copper, formation of the circuit on the outer layer and so on. Thereafter, any resin or parting spacer inserted in the aforementioned opening is removed or any area marked by the cut-off line is removed to complete the preparation of a rigid-flex wiring board.

As described above, the manufacture of rigid-flex wiring boards usually requires the use, both as an interlayer adhesive sheet and as an insulating layer between the flexible and rigid wiring boards, of resin film with an opening formed in the portion where the flexible wiring board is exposed to become the flexible layer. Conventionally, a procedure such as die punching and pin punching has been used to form an opening of a specified shape at a specified spot in the resin film intended for the manufacture of a rigid-flex wiring board such as the aforementioned. There has been a demand for establishment of a process for manufacturing rigid-flex wiring boards involving the use of resin film as an interlayer adhesive layer of higher accuracy and efficiency.

In a double-sided carrier tape useful as an electronic part, wiring patterns such as inner lead are arranged on the surface of a tape-shaped insulating base material and these patterns are connected to the ground patterns on the back of the base material by means of via holes and device holes.

A via hole is a through-hole which pierces the insulator and reaches a lead and its wall is plated with copper to provide a conductive path from the patterns on the surface to those on the back side. Wet etching is adopted for making via holes and is performed as follows. A copper foil is coated with a photoresist, photolithography is applied to form the desired via hole pattern, the exposed copper foil is etched and the photoresist is peeled off thereby forming a via hole pattern on the copper foil and exposing the insulator at the spot where the desired via hole is to be formed. Thereafter, using the copper foil on which the desired via hole pattern has been formed as an etching mask, the base material is immersed in a strongly alkaline solution to etch the entire exposed portion of the insulator and remove it completely to form a through-hole.

However, a trend toward higher density of wiring patterns in recent years has necessarily created the same trend toward higher density of via holes and there has been a demand for establishment of a process for manufacturing double-sided carrier tapes involving the use of resin film as an insulating layer of higher accuracy and efficiency.

The pulsed carbon dioxide gas laser beam is known to be applicable to drilling of holes in resin film constituting a wiring board or a carrier tape [J. Phys. D: Appl. Phy. 30 (1997) L19 and elsewhere]. However, the pulsed laser beam needs to be applied without a break in case the object to be machined extends continuously beyond the irradiation range of one pulse of the pulsed laser beam, for example, in case a slender continuous area is drilled to form openings; this means that irradiation with plural pulses takes a long time or removal of resin occupying a continuous wide area takes a long time and, in consequence, it is difficult to drill holes in the resin efficiently. Concretely, this difficulty rises in the cases where the resin to be removed occupies an area of more than 0.2 $cm^2$ which is the standard irradiation range per pulse of the pulsed laser beam.

An object of this invention is to provide a highly efficient and accurate process for laser beam machining of resin film to be used in laminates such as wiring boards and carrier tapes. Another object is to provide a highly efficient and accurate process for manufacturing rigid-flex wiring boards. Still another object is to provide a highly efficient and accurate process for manufacturing double-sided carrier tapes.

DISCLOSURE OF THE INVENTION

The present inventors have conducted intensive studies, arrived at the following findings which can solve the aforementioned problems, and completed this invention; a continuous-wave laser beam which is scanned with regularity in one or two ways can machine the resin with the product quality equal to or higher than that obtainable by a pulsed laser beam due to the annealing effect characteristic of a continuous-wave laser beam, realize a high average output at the same time thereby making it possible to form an opening in the resin at high speed and, in addition, remove resin occupying an area of 0.2 cm$^2$ or more, which has been difficult to do by the conventional technique of laser beam machining.

In a laminate comprising at least one layer of resin film and at least two layers of patterned conductors, this invention relates to a laminate wherein openings are formed in at least one of the layers of resin film by irradiating the resin film with a continuous-wave laser beam which is scanned in one or two ways while moving the resin film nearly at a right angle to the scanning direction of the laser beam with the use of a continuous-wave carbon dioxide gas laser beam machine equipped with a device for scanning the laser beam in one or two ways and a worktable capable of moving the resin film nearly at a right angle to the scanning direction of the laser beam.

Moreover, this invention relates to a process for laser beam machining of resin film for a wiring board or to a process for manufacturing resin film for a multilayer wiring board which comprises forming openings in the resin film by irradiating the resin film with a continuous-wave laser beam which is scanned in one or two ways while moving the resin film nearly at a right angle to the scanning direction of the laser beam with the use of a continuous-wave carbon dioxide gas laser beam machine equipped with a device for scanning the laser beam in one or two ways and a worktable capable of moving the resin film nearly at a right angle to the scanning direction of the laser beam. Still more, this invention relates to a process for manufacturing a rigid-flexible printed wiring board comprising at least one layer of the aforementioned resin film for a mutlilayer wiring board as an insulating layer.

Furthermore, in a process for manufacturing a double-sided carrier tape from a laminate containing a first layer of conductor, a layer of resin film mainly composed of polyimide and a second layer of conductor, this invention relates to a process for manufacturing a double-sided carrier tape which comprises drilling holes in the first layer of conductor on the surface by etching, drilling holes in the layer of resin film as via holes reaching the second layer of conductor beneath the holes by irradiating the laminate with a continuous-wave carbon dioxide gas laser beam which is scanned in one or two ways while moving the laminate nearly at a right angle to the scanning direction of the laser beam and controlling the energy density on the irradiated surface at 3–50 J/cm$^2$ with the use of a continuous-wave carbon dioxide gas laser beam machine equipped with a device for scanning the laser beam in one or two ways and a worktable capable of moving the laminate nearly at a right angle to the scanning direction of the laser beam, and forming layers of conductor on the via holes by electrolytic or electroless plating.

In the laser beam machining of resin film in the laminates for wiring boards, in the manufacture of resin film for multilayer wiring boards and in the manufacture of rigid-flexible printed wiring boards and double-sided carrier tapes according to the aforementioned processes of this invention, it is preferable to use a carbon dioxide gas laser operable on a continuous-wave basis and emitting at a wavelength of 9.2–9.7 μm and to control the energy density on the surface irradiated by the laser beam at 3–50 J/cm$^2$. Moreover, it is preferable that the area of at least one opening to be formed in the resin film is 0.2 cm$^2$ or more and the resin film is made from polyimides containing silicone units or from a composition thereof with epoxy resins, either uncured or half-cured.

The process of this invention for manufacturing a rigid-flex printed wiring board will be described in detail.

As for the kind of resin film to be used in a multilayer wiring board, there is no specific restriction on properties other than good insulating quality and a variety of publicly known resin films can be used. Materials useful for insulating resin films include epoxy resins, polyimides and polyesters or compositions thereof. Since manifestation of an adhesive property under heat is required for the resin in the step for manufacturing the rigid part by lamination, polyimide or a resin composition containing polyimide is preferable as such resin, in particular, silicone-modified polyimide containing silicone units. The resin compositions formulated from 70–99% by weight of polyimides containing silicone units and 1–30% by weight of epoxy resins described in Japan Kokai Tokkyo Koho 06-200216 (1994) are cited as a preferable example. In the case of a polyimide-epoxy resin composition, the resin is preferably uncured or half-cured, that is, in the B-stage.

The thickness of resin film is preferably 1 μm or more and 1,000 μm or less, although there is no specific restriction on it. It is difficult to prepare resin film with a thickness of less than 1 μm while resin film with a thickness in excess of 1,000 μm is difficult to machine by laser beam because of high energy requirement and, besides, increases the thickness of a multilayer wiring board so much as to be impractical.

This resin film is machined by a laser beam to form openings in the region which is to become the flexible part in the manner to be described later and then laminated to the wiring board constituting the rigid part. The method for lamination is not specific and a preferable one is to carry out lamination under heat and pressure at 160–220° C. and 20–40 kg/cm$^2$ with the use of a molding machine such as a hot press or a hot roll. The laminated wiring board goes through the steps for drilling of holes, plating with metal and formation of a circuit on the layer of conductor in a specified manner to give a rigid-flex wiring board.

Drilling of holes in the aforementioned laminated wiring board may be performed by a known method such as NC hole drilling and, in case the openings are plated with copper to form through-holes, a known procedure such as electroless plating or electrolytic plating may be utilized. A circuit is formed on the layer of conductor on the surface by a known procedure, for example, by applying photosensitive resin or laminating ordinary photosensitive dry film, irradiating the layer of photosensitive resin by UV through the desired mask pattern, developing and etching by an etchant such as ferric chloride.

The process of this invention for manufacturing a double-sided carrier tape by drilling holes in the insulating resin film by a laser beam will be described in detail.

In this invention, the base material to be machined by a laser beam is a laminate consisting of an insulating layer of resin in the middle and layers of conductors on both sides. Resin film to be used as the insulating layer is mainly containing polyimide, for example, polyimide or modified polyimide. In consideration of dimensional stability after machining, it is preferable for the resin to have a thermal expansion coefficient of 3×10$^{-5}$/° C. or less. Where the thermal expansion coefficient exceeds this, the difference in thermal expansion coefficient between the layer of resin and the layer of conductor becomes so large as to cause warping after machining of the layer of conductor. The thickness of the resin film is 5–100 μm, preferably 10–50 μm in consideration of the balance of the ease of laser beam machining and the insulation quality.

Metals useful for the conductive layer include copper, aluminum, iron, silver, palladium, nickel, chromium, molybdenum, tungsten and their alloys and copper is preferable among them.

In this invention, the layer of conductor on one side is processed by wet etching or the like in advance and used as a conformal mask in the laser beam drilling of through-holes for the formation of via holes. First, one of the layers of conductors on the laminate to be fabricated into a double-sided carrier tape is coated with photosensitive dry film or photosensitive resin, exposed with the use of a mask pattern, developed, and etched with an etchant to form openings in the layer of conductor to prepare a conformal mask. Next, the layer of conductor with the openings was stripped of the insulating layer of resin film at the openings by the technique for laser beam machining of resin film to be described later thereby forming holes for the formation of via holes and exposing the layer of conductor on the opposite side.

Thereafter, the layer of conductor is fabricated to form a circuit and a double-sided carrier tape is prepared. The circuit may be formed by a known method, for example, by applying photosensitive dry film or photosensitive resin, exposing with the use of mask pattern, developing and etching by an etchant.

In this invention, in order to form openings of a specified size in the aforementioned resin film or in the layer of resin film in the laminate for a double-sided carrier tape, the portion to be opened is irradiated with a laser beam which is emitted from a laser and scanned. A laser useful here is a carbon dioxide gas laser because it is not a large-sized equipment, it is easy to handle and maintain and it can emit a continuous-wave laser beam.

A known carbon dioxide gas laser beam machine may be used in the machining of the resin film or a layer of resin film by a continuous-wave carbon dioxide gas laser. An apparatus capable of emitting a continuous-wave laser beam at a wavelength in the range 9–11 $\mu$m, preferably in the range 9.2–9.7 $\mu$m where the absorption coefficient against the resin film is high, with an average output of 100 W or more, preferably 500 W or more, is satisfactorily used.

The continuous-wave laser beam emitted from a laser needs to be scanned in order to irradiate the portion from where the resin film is to be removed. Scanning is made possible by resorting to a driving mirror scanner which is publicly known in laser beam machining. Known and useful as such a driving mirror scanner is a galvanomirror scanner in which a plane mirror is reciprocated in a rotational movement at a certain angle to an axis containing the plane or a polygon mirror scanner in which a polygon mirror is rotated. In case a galvanomirror scanner is used, the laser beam scanned by the reciprocating movement can be applied as a laser beam scanned in two ways to the resin film or the laser beam scanned in either way in reciprocating scanning as a laser beam scanned in one way.

Laser beam machining on a continuous basis is normally performed with the use of a worktable which is capable of moving the object to be machined at a constant speed in a constant direction. That is, the aforementioned scanned laser beam is applied to the resin film which is moving on the worktable in a given direction and it is applied while being scanned in the direction of the moving resin film (Y direction) and in the direction at a right angle to the direction of the moving resin film (X direction).

The aforementioned scanned laser beam may be condensed by an optical lens, preferably by a lens made of ZnSe because of its high transmission of the laser beam.

During the machining of resin film (with a combination of a driving mirror scanner and an optical lens), it sometimes happens that the laser beam incident on resin film provided with a conformal mask or contact mask is partly reflected without being absorbed by the mask and goes backward through roughly the same light path to the laser. The laser beam thus going backward to the laser would conceivably cause induced emission having nothing to do with laser emission thereby decreasing the gain or the amplification factor of laser emission and, as a result, would lower the output of laser emission. Moreover, there is the possibility of the reversed laser beam hitting the wall of the resonator of the laser and breaking the resonator itself. Therefore, it is desirable to prevent the laser beam reflected on the mask from going backward to the laser.

One of preventive measures is to arrange an optical system involving a polarization rotators which utilizes the polarization of the laser beam or an antireflection mirror between the laser and the resin film. In this case, however, the emitted laser beam is in part reflected or absorbed by such an optical system and loses some of the energy to irradiate the resin film with the resultant loss in efficiency.

An approach to prevent such a loss in efficiency and to prevent the laser beam from going backward is to arrange a driving mirror scanner in such a manner as to make the incident angle of the laser beam to the resin film in excess of 0°. Concretely, by tilting the driving mirror scanner at an angle in the range 2–20° and controlling the incident angle of the laser beam to the resin film in the range 2–20°, it is possible to prevent the laser beam reflected by the mask from going backward to the laser without reducing the incident energy of the laser beam. In case the incident angle is less than 2°, the laser beam reflected by the mask partly goes back to the laser. On the other hand, when the incident angle exceeds 20°, the reflected laser beam does not go backward, but the sectional shape of the resin film after laser beam machining is undesirably tilted in correspondence to the incident angle.

A worktable for moving and/or fixing the resin film to be machined is adequate if it is provided with a mechanism to allow the worktable to move at a constant speed in the direction (Y direction) at a right angle to the scanning direction of the driving mirror scanner (X direction). The worktable is not restricted in shape and it may be flat or cylindrical. In case the worktable is cylindrical, the cylinder must be arranged so that the scanning direction of the laser beam by the driving mirror scanner nearly coincides with the central axis of the cylinder. The manner in which the resin film is fixed to or adhered closely to the worktable is not specific; for example, by vacuum-sucking through a minute hole provided in the worktable or using a ferromagnetic substance and a magnet where the worktable is flat or by using a tension roll or a sprocket where the table is cylindrical. What is required in either case is a variable control of the moving speed of the resin film; variable by 0.1 cm/s at a time at least in the range 0.1–2 cm/s, preferably variable by 0.01 cm/s at a time in the range 0.01–10 cm/s.

In the cases where the resin film or carrier tape to be machined is in the form of a tape, a continuous operation can be arranged by placing a pair of reels before and after the aforementioned worktable and letting one reel unwind a roll of the tape at a constant speed at regular intervals and the other wind the tape into a roll.

Laser beam machining of resin film or a layer of resin film may generate soot as a by-product from the decomposition of the insulating layer and the soot may adhere to the wiring board or to the optical lens constituting the laser beam machine. Adhesion of soot undesirably lowers the quality of resin film or the performance of the laser beam machine. Therefore, for the purpose of removing soot and other by-products from decomposition, it is desirable to provide a gas blasting apparatus, for example, the so-called assist gas apparatus, an air curtain apparatus and a dust collector for recovery of soot. An apparatus generally known for this type of work will function satisfactorily here. The kind of gas to be used in an assist gas apparatus or air curtain apparatus is not restricted and it is allowable to use air compressed to 5 kg/cm² or so.

In the laser beam machining of resin film or a layer of resin film with the use of a laser beam machine such as described above, the energy density $\phi_0$(J/cm²) of the laser beam applied to the resin film is controlled by the average output of the laser, the sectional area of the laser beam bundle on the surface of the resin film and the speed on the resin film of the laser beam scanned by the driving mirror scanner and it is decided by the machining threshold $\phi_{th}$(J/cm²) in the laser beam machining of the resin, preferably in the range 2 $\phi_{th} < \phi_0 < 20$ $\phi_{th}$. In particular, the energy density is preferably in the range 3–50 J/cm² in case the resin film is mainly containing polyimide, cardo-type resin or epoxy resin.

Moreover, the moving speed v (cm/s) of the resin film or carrier tape is decided by the absorption coefficient $\alpha$ (cm⁻¹), the thickness of the film to be machined L (cm), the sectional diameter d (cm) of the laser beam bundle on the surface of the resin film, and the scanning frequency G (Hz) which is the number of scanning by the driving mirror scanner against the resin film in one second and it is preferably in the following range:

$$0.5 \times (dG/\alpha L) < v < 4.0 \times (dG/\alpha L)$$

BRIEF DESCRIPTION OF THE DRAWINGS

FIG. 1 is a schematic drawing of a continuous-wave carbon dioxide gas laser beam machine wherein 1 is a lasing apparatus, 3 is a condensing lens, 4 is a scanning device and 5 is a worktable.

PREFERRED EMBODIMENTS OF THE INVENTION

EXAMPLE 1

The processes of this invention for the laser beam machining of resin film and for the manufacture of a rigid-flexible printed wiring board will be described in detail with reference to examples.

A bonding sheet SPB050A available from Nippon Steel Chemical Co., Ltd. (thickness 50 μm, based on a composition of silicone-modified polyimide and epoxy resin, B-stage) was used as resin film to serve as an interlayer adhesive sheet between a flexible wiring board and a rigid wiring board of a rigid-flex wiring board.

Figure 2:
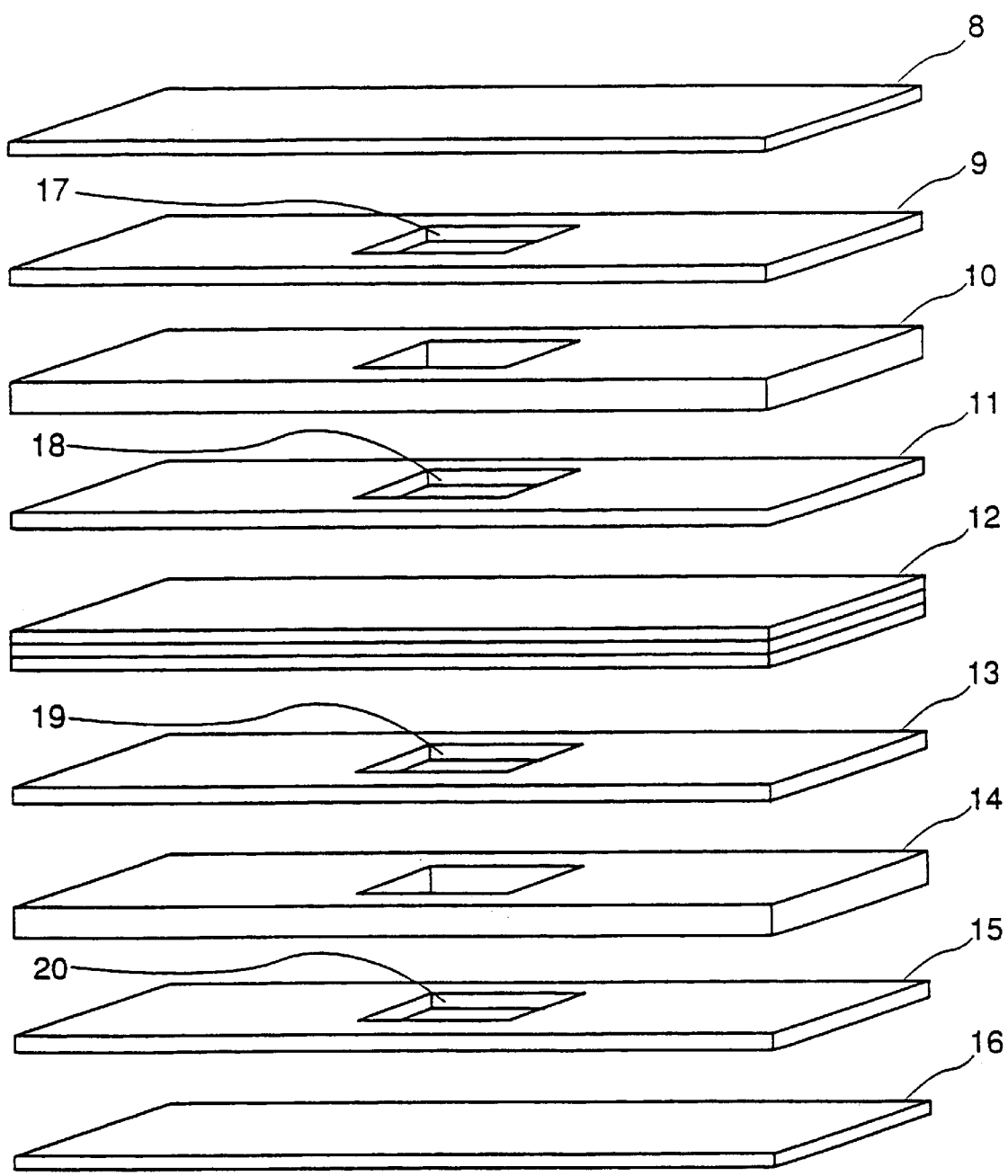
FIG. 2 is an oblique view of the layered structure of a multilayer wiring board containing resin films 9, 11, 13 and 15.

The resin film for a wiring board was machined with the use of an apparatus, such as shown in FIG. 1, consisting of the carbon dioxide gas laser operable on a continuous-wave basis 1, the condensing lens 3, the galvanomirror scanner 4 scanning in two ways, and the worktable 5 which moves in the direction nearly at a right angle to the scanning direction of the galvanomirror scanner. In FIG. 1, lines 2 and 7 denote the laser beam. The resin film was machined to form the openings 17, 18, 19 and 20 which are shown in FIG. 2. The flexible wiring board becomes exposed at these openings and forms the flex part. A metal mask was used in contact in forming the openings by laser beam machining. The opening in the contact mask measures 100 mm×50 mm with an area of 50 cm².

The laser beam machining of the resin film was performed under the following conditions: the average output of laser emission 720 W; the condensing area of the laser beam 9.62×10⁻⁴ cm²; the scanning width of the laser beam 100 mm; the moving speed of the wiring board 12 mm/s; and the scanning frequency of the galvanomirror scanner 50 Hz.

A laminate copper-cladded on both sides (SB35-50-35WE) available from Nippon Steel Chemical Co., Ltd. as a base material for a flexible wiring board was laminated to commercially available photosensitive dry film, the desired mask pattern was placed on it, irradiated with UV, developed, etched by an etchant such as ferric chloride to form a circuit, and covered with coverlay film (SPC35A25A) available from Nippon Steel Chemical Co., Ltd. to prepare a flexible wiring board 12. The coverlay film was applied by pressing it at 30 kg/cm² while heating it from room temperature at a rate of 3° C./min, holding it at 180° C. for 1 hour, and cooling it to room temperature by water in 20 minutes.

The flexible wiring board 12 in the middle, rigid wiring boards 10 and 14 which are to become the flex part and provided with openings formed as specified at the center, the resin films 9, 11, 13, and 15 respectively provided with the openings 17, 18, 19 and 20 formed by the aforementioned laser beam machining and placeable one upon another, and copper foils 8 and 16 as outer layers were arranged as in FIG. 2 and laminated simultaneously by hot pressing. The pressing was performed at 20 kg/cm² by heating the assembly from room temperature at a rate of 3° C. /min, holding it at 180° C. for 1 hour, and cooling it to room temperature by water in 20 minutes.

The rigid-flex wiring board thus prepared indicated that the pressing operation of the resin film serving as an adhesive sheet was so controlled as not to cause oozing of the adhesive sheet and confirmed improved accuracy in machining and high efficiency of the manufacturing method.

EXAMPLE 2

Figure 3:
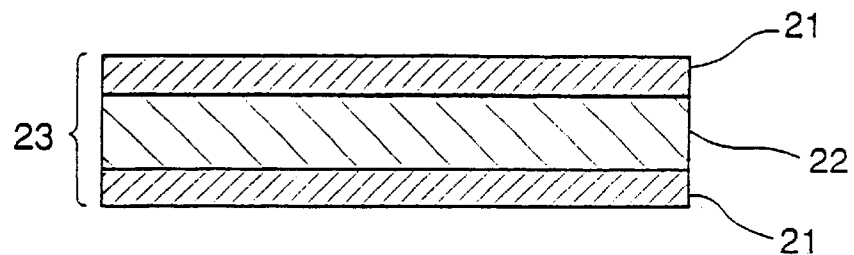
FIG. 3 is the cross section of a copper-clad laminate containing copper foils 21 and a layer of resin film 22.
Figure 4:
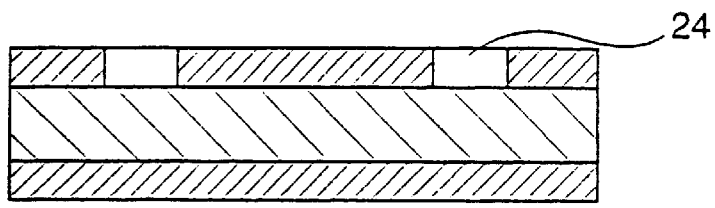
FIG. 4 illustrates the state of openings formed by etching the copper foil.

Referring to FIG. 3, an adhesive-free copper-clad laminate (Espanex SB18-50-18WE, trade name of Nippon Steel Chemical Co., Ltd.) of a three-layer structure composed of the insulating layer 22 of polyimide film clad on both sides with layers of copper foils 21 was used as the base material laminate 23. Photosensitive dry film was laminated to a first copper foil on one side of the laminate 23, exposed to UV through a mask pattern and developed. Thereafter, etching was effected by a ferric chloride solution and the dry film was removed to provide the laminate 23 with openings 24 as shown in FIG. 4.

Figure 5:
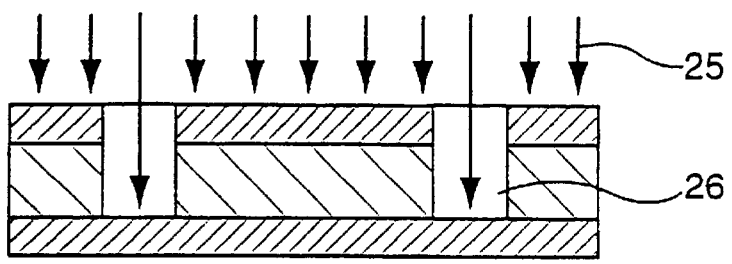
FIG. 5 illustrates the state of via holes 26 formed by laser beam machining in the insulating layer of resin film.

The side provided with openings 24 was then irradiated with a continuous-wave carbon dioxide gas laser beam. A laser beam machine such as shown in FIG. 1 was used in the operation. The machine in use was equipped with the carbon dioxide gas laser operable on a continuous-wave basis 1, the galvanomirror scanner 4 scanning in two ways and the worktable 5 which moved in the direction nearly at a right angle to the scanning direction of the galvanomirror scanner. By the way, the condensing lens 3 was not used in this example and, instead, the condensing lens 6 (not shown) was placed between the galvanomirror scanner 4 and the worktable 5. As shown in FIG. 5, the laser beam 25 passing through the opening 24 drills a hole in the insulating layer 2 to form a hole 26 for the formation of a via hole. The laser beam machining was performed under the following conditions: the average output of laser emission 600 W; the condensing area of the laser beam $9.62 \times 10^{-4}$ cm$^2$; the scanning width of the laser beam 100 mm; the moving speed of the worktable 10 mm/s; the frequency of the galvanomirror scanner 50 Hz.

Figure 6:
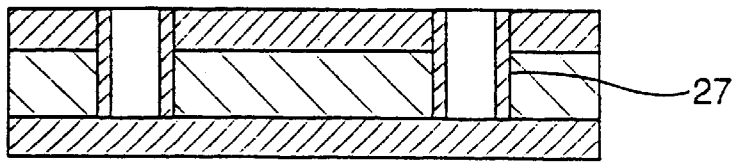
FIG. 6 illustrates the state of layers of conductors formed by plating.

Then, the whole area including the surface of the wall of via hole-forming hole 26 was coated with copper with the use of an electroless copper plating liquor and a blind through-hole 27 shown in FIG. 6 was formed. Furthermore, with the copper coat as the cathode, electrolytic copper plating was effected with the use of an electrolytic plating liquor at a current density of 200 mA/cm$^2$. The thickness of copper plating was 10 µm.

Figure 7:
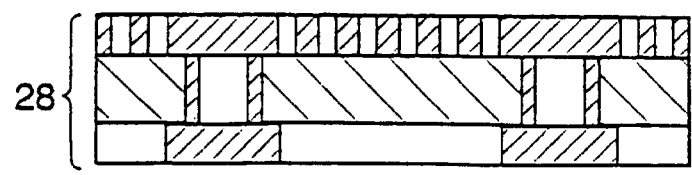
FIG. 7 is the cross section of a double-sided carrier tape after formation of a circuit on the copper foil.
Figure 8:
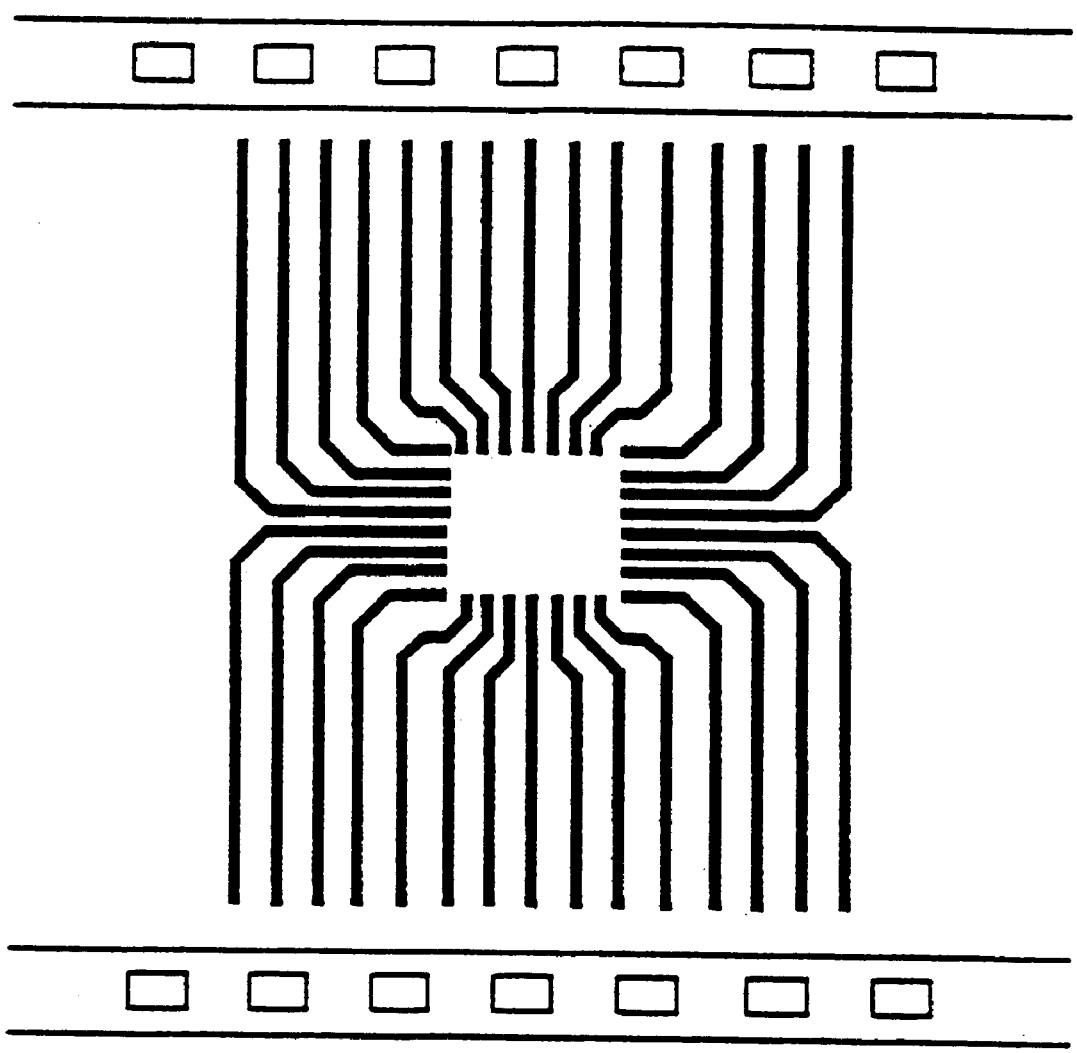
FIG. 8 is a ground plan of a double-sided carrier tape.

Photosensitive dry film was laminated to both sides of the laminate thus prepared and exposed to UV through double-sided pattern masks, one provided with signal lines such as inner lead and outer lead on the surface of the first copper foil and another provided with a ground pattern on the surface of the back side or the second copper foil, and developed. Then, double-sided etching by a ferric chloride solution followed, the dry film was removed and a double-sided carrier tape with a circuit pattern as shown in FIG. 7 was obtained. Another example of a ground plan of a circuit pattern is shown in FIG. 8.

A protective resist was applied by screen printing to the wiring lead part of the surface containing the circuit pattern and the resist was dried. Likewise, the protective resist was applied to the side of ground pattern and, finally, the wiring lead part was subjected to surface treatment such as gold plating or tin plating to finish the double-sided carrier tape.

COMPARATIVE EXAMPLE 1

As in Example 2, the opening 24 was formed in the first conductive layer 21 as shown in FIG. 4 and then a via hole-forming hole 26 was drilled by a Q-switched pulsed laser beam with the use of a carbon dioxide gas laser beam machine operable on a continuous-wave basis as shown in FIG. 5. The laser beam machining was performed under the following conditions: the average output of laser emission 500 W; the condensing area of the laser beam $9.62 \times 10^{-4}$ cm$^2$; the scanning width of the laser beam 100 mm; the moving speed of the base material 8 mm/s; the frequency of the galvanomirror scanner 50 Hz. Drilling of holes could not be performed completely at a moving speed in excess of 8 mm/s and, at most, drilling was possible at a speed less by 2 mm/s than that in Example 2. The steps thereafter were the same as in Example 2 to finish the double-sided carrier tape.

INDUSTRIAL APPLICABILITY

The process of this invention makes it possible to form openings or drill holes in resin film with high accuracy at high efficiency. Highly accurate and efficient machinability in cutting and drilling of an adhesive sheet which serves as an insulating layer of resin in a multilayer wiring board enables the manufacture of a highly reliable multilayer wiring board. Moreover, a via hole can be formed with high accuracy and this makes it easy to form via holes in higher density with reduced diameter to meet the trend toward the use of multiple pins in double-sided carrier tapes and contributes to the manufacture of high value-added double-sized carrier tapes.

What is claimed is:

1. In laser beam machining of resin film made from polyimide or resin mainly containing polyimide for a wiring board, a process for laser beam machining of resin film for a wiring board which comprises forming openings in the resin film by irradiating the resin film with a continuous-wave laser beam which is scanned in one or two ways while moving the resin film in the direction nearly at a right angle to the scanning direction of the laser beam and controlling the energy density on the irradiated surface at 3–50 J/cm$^2$ with the use of a continuous-wave carbon dioxide gas laser beam machine emitting at a wavelength of 9.2–9.7 µm equipped with a device for scanning the laser beam in one or two ways and a worktable capable of moving the resin film in the direction nearly at a right angle to the scanning direction of the laser beam.

2. A process for laser beam machining as described in claim 1 wherein the incident angle of the laser beam applied to the resin film is controlled at 2–20°.

3. A process for laser beam machining as described in claim 1 wherein the moving speed of the resin film v (cm/s), the absorption coefficient of the resin film α (cm$^{-1}$), the thickness of the film to be machined L (cm), the sectional diameter of the laser beam bundle on the surface of the resin film d (cm) and the scanning frequency G (Hz) satisfy the following relationship;

$$0.5 \times (dG/\alpha L) < v < 4.0 \times (dG/\alpha L).$$

4. A process for laser beam machining as described in claim 1 wherein at least one of the openings to be formed in the resin film has an area of 0.2 cm$^2$ or more.

5. A process for laser beam machining as described in claim 1 wherein the resin film is made from polyimide containing silicone units or said resin in the uncured or half-cured condition.

6. A process for manufacturing resin film for a multilayer wiring board which comprises forming openings in the resin film made from polyimide or resin mainly containing polyimide by irradiating the resin film with a continuous-wave laser beam which is scanned in one or two ways while moving the resin film in the direction nearly at a right angle to the scanning direction of the laser beam and controlling the energy density on the irradiated surface at 3–50 J/cm$^2$ with the use of a continuous-wave carbon dioxide laser beam machine emitting at a wavelength of 9.2–9.7 µm equipped with a device for scanning the laser beam in one or two ways and a worktable capable of moving the resin film in the direction nearly at a right angle to the scanning direction of the laser beam.

7. In a process for manufacturing a double-sided carrier tape which comprises machining a laminate consisting of a first layer of conductor, a layer of resin film mainly composed of polyimide and a second layer of conductor, a process for manufacturing a double-sided carrier tape which comprises forming holes in the first layer of conductor on the surface by etching, forming holes in the layer of resin film as via holes reaching the second layer of conductor beneath the holes by irradiating the laminate with a continuous-wave carbon dioxide gas laser beam which is scanned in one or two ways while moving the laminate in the direction nearly at a right angle to the scanning direction of the laser beam and controlling the energy density on the irradiated surface at 3–50 J/cm$^2$ with the use of a continuous-wave dioxide gas laser beam machine emitting at a wavelength of 9.2–9.7 μm equipped with a device for scanning the laser beam in one or two ways and a worktable capable of moving the laminate in the direction nearly at a right angle to the scanning direction of the laser beam, and forming layers of conductors on the via holes by electrolytic plating or electroless plating.

8. A process for manufacturing a double-sided carrier tape as described in claim 7 wherein the layer of resin film is made from polyimide or modified polyimide with a thermal expansion coefficient of $3 \times 10^{-5}$/° C. or less.

* * * * *

UNITED STATES PATENT AND TRADEMARK OFFICE
CERTIFICATE OF CORRECTION

PATENT NO.    : 6,492,616 B1
DATED         : December 10, 2002
INVENTOR(S)   : Tanaka et al.

It is certified that error appears in the above-identified patent and that said Letters Patent is hereby corrected as shown below:

<u>Title page,</u>
Item [86], please replace with the following corrections:
-- [86]  PCT No.:      PCT/JP00/03288)
         §371 (c)(1),
         (2), (4) Date:   Dec. 18, 2001 --

Signed and Sealed this

Second Day of September, 2003

JAMES E. ROGAN
*Director of the United States Patent and Trademark Office*